United States Patent
Boggs et al.

(10) Patent No.: US 7,061,095 B2
(45) Date of Patent: Jun. 13, 2006

(54) PRINTED CIRCUIT BOARD CONDUCTOR CHANNELING

(75) Inventors: David W. Boggs, Hillsboro, OR (US); Rebecca Jessep, Dallas, OR (US); Carolyn McCormick, Hillsboro, OR (US); Daryl Sato, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 284 days.

(21) Appl. No.: 09/962,094

(22) Filed: Sep. 26, 2001

(65) Prior Publication Data
US 2003/0061590 A1    Mar. 27, 2003

(51) Int. Cl.
*H01L 23/48* (2006.01)
*H01R 9/00* (2006.01)
*H05K 1/03* (2006.01)

(52) U.S. Cl. ............. 257/692; 257/700; 257/773; 257/786; 361/774; 361/777; 174/255; 174/262

(58) Field of Classification Search ........ 257/700–703, 257/773, 774, 786; 438/622
See application file for complete search history.

(56) References Cited

U.S. PATENT DOCUMENTS

| | | | | |
|---|---|---|---|---|
| 5,357,138 A | * | 10/1994 | Kobayashi | 257/664 |
| 5,399,898 A | * | 3/1995 | Rostoker | 257/499 |
| 5,473,120 A | * | 12/1995 | Ito et al. | 174/264 |
| 5,883,335 A | * | 3/1999 | Mizumoto et al. | 174/266 |
| 6,124,553 A | * | 9/2000 | Narizuka et al. | 174/260 |
| 6,297,146 B1 | * | 10/2001 | Lopatin | 438/625 |
| 6,340,841 B1 | * | 1/2002 | Iijima et al. | 257/700 |
| 6,388,890 B1 | * | 5/2002 | Kwong et al. | 361/780 |
| 6,400,021 B1 | * | 6/2002 | Cho | 257/738 |
| 6,462,416 B1 | * | 10/2002 | Marathe et al. | 257/751 |
| 6,498,397 B1 | * | 12/2002 | Achuthan et al. | 257/758 |
| 6,630,631 B1 | * | 10/2003 | Dishongh et al. | 174/262 |
| 6,657,303 B1 | * | 12/2003 | Wang et al. | 257/758 |

FOREIGN PATENT DOCUMENTS

JP          10092924 A    *    4/1998

* cited by examiner

*Primary Examiner*—Alonzo Chambliss
(74) *Attorney, Agent, or Firm*—Schwegman, Lundberg, Woessner & Kluth, P.A.

(57) ABSTRACT

A printed circuit board and a system and method of embedding conductor channels into a printed circuit board. These conductor channels are used to provided increased power to circuits on the printed circuit board, provide shielding for these circuits and provide communications for these circuits. These conductor channels are created by ablating dielectric layers in the printed circuit board and depositing a conductive material therein.

17 Claims, 8 Drawing Sheets

PRINTED CIRCUIT BOARD CONDUCTOR CHANNELING

FIELD

Various embodiments may relate to a printed circuit board and to a system and method for printed circuit board conductor channeling. More particularly, embodiments of the present invention may include a system and method for forming conductor channels in the process of manufacturing printed circuit boards.

BACKGROUND

In the rapid development of computers many advancements have been seen in the areas of processor speed, throughput, communications, and fault tolerance. Today's microprocessors have achieved speeds of 2 Ghz with no upper end insight. However, no matter what the component or how fast it operates, communications still must be established between one component of a communications system, computer, or other form of electronic equipment. In the early days of computers such communications between components were established via wire wrapped boards. A substrate would have numerous holes drilled into it and small posts embedded in each hole and extending below the substrate. Wires would then be wrapped around each post to connect one post to another. The electronic components would then be inserted into holes contained in each post. However, as can be imagined this was a cumbersome, time-consuming task was numerous error prone manufacturing stages.

Figure 1:
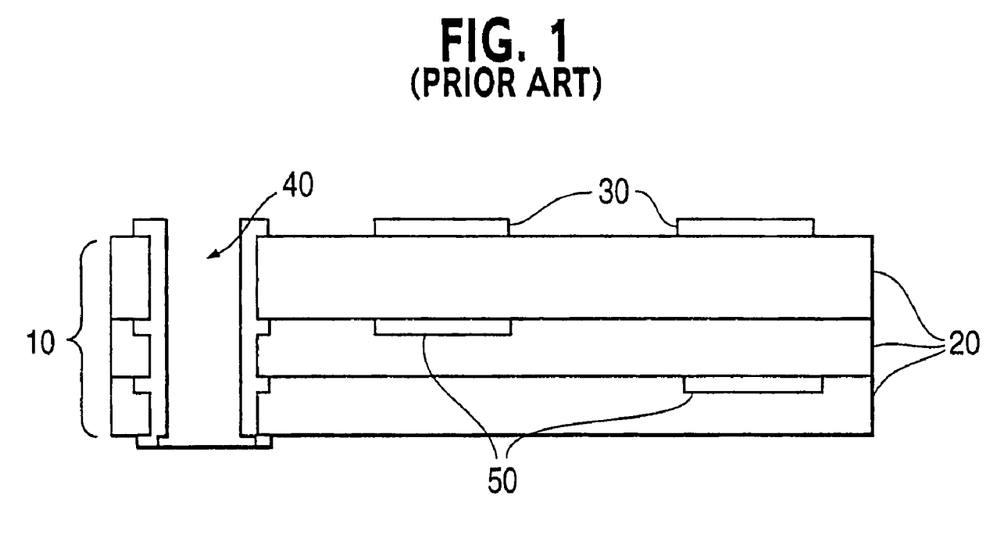
FIG. 1 is an example of a cross section of a printed circuit board (PCB)

Wire wrapped boards were completely eliminated through the development of multiple layer printed circuit boards. A cross-sectional diagram of such a printed circuit board is illustrated in FIG. 1. This printed circuit board (PCB) 10 is made up of several layers of dielectric material 20. This dielectric material 20 may be composed of a glass epoxy fiber or other nonconductive material. Embedded on the surface of this PCB 10 may be contained surface horizontal conductive features 30. In addition between the layers of dielectric material 20 may be embedded horizontal conductive features 50. These surface and embedded horizontal conductive features 30 and 50 would serve to provide power to the printed circuit board components and establish communications between printed circuit board components. Various layers of surface and embedded conductive features 30 and 50 would be connected via through holes 40 which may be plated or filled with a conductive material and used to establish connections between PCB components and various dielectric layers 20 having surface and embedded conductive features 30 and 50.

However, due to the limitations of utilizing surface and embedded components, conductive features 30 and 50 along with through holes 40 several difficulties arise for PCB designers. First, shielding of selective components within the PCB 10 from electromagnetic radiation may prove difficult. Second, providing greater power and heat dissipation to selective components in the PCB 10 may prove to be more difficult. Third, using through holes 40, it may be difficult to connect inner layers of conducted features on embedded dielectric layers 20 without completely drilling through the entire PCB 10.

Therefore, what is required is a printed circuit board and a system and method in which shielding may be provided for selective portions of a PCB 10. Further, this system and method should provide a printed circuit board with greater power routing and heat dissipation both in the inner layers of the PCB 10 and the surface layer of the PCB 10 to some determined depth. In addition, printed circuit boards produce according to this system and method should reduce the number of through holes 40 required to connect various surface and embedded traces such as conductive features 30 and 50.

BRIEF DESCRIPTION OF THE DRAWINGS

The foregoing and a better understanding of the present invention will become apparent from the following detailed description of exemplary embodiments and the claims when read in connection with the accompanying drawings, all forming a part of the disclosure of this invention. While the foregoing and following written and illustrated disclosure focuses on disclosing some example embodiments of the invention, it should be clearly understood that the same is by way of illustration and example only and the invention is not limited thereto. The spirit and scope of the present invention are defined by the terms of the appended claims and their equivalents.

The following represents brief descriptions of the drawings, wherein.

DETAILED DESCRIPTION

Before beginning a detailed description of some example embodiments of the subject invention, mention of the following is in order. When appropriate, like reference numerals and characters may be used to designate identical, corresponding or similar components in differing figure drawings. Further, in the detailed description to follow, exemplary sizes/models/values/ranges may be given, although the present invention is not limited to the same. As a final note, well-known components of computer networks may not be shown within the FIGS. for simplicity of illustration and discussion, and so as not to obscure the invention.

Figure 2:
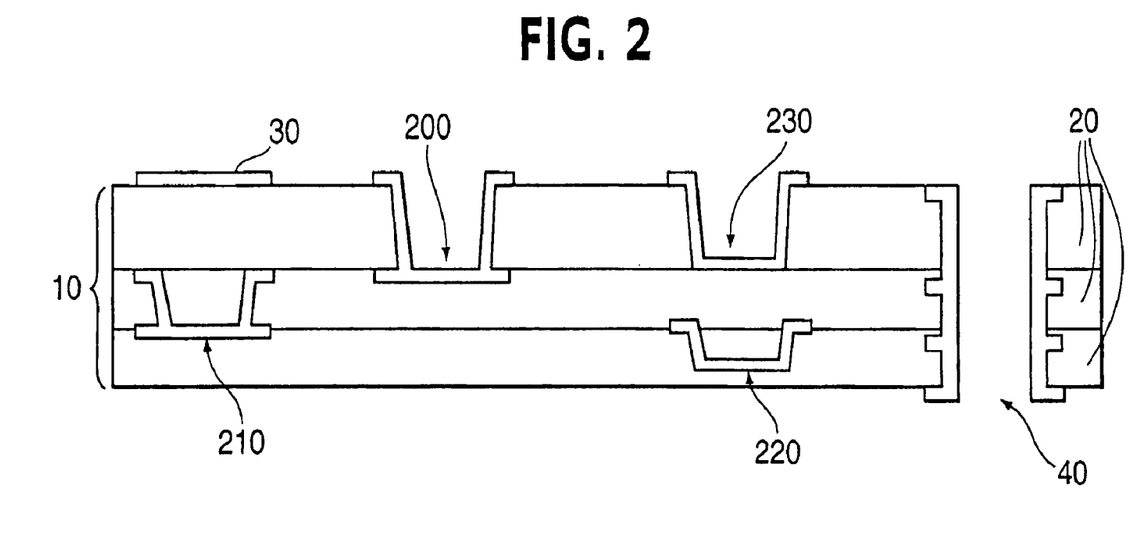
FIG. 2 is a cross-sectional view of the printed circuit board with conductor channeling in an example embodiment of the present invention.

FIG. 2 is a cross-sectional view of the printed circuit board 10 with conductor channeling in an example embodiment of the present invention. This printed circuit board (PCB) 10 is similar to that shown in FIG. 1 in so far as it is made up of several layers of dielectric material 20. This dielectric material 20 may be composed of, but not limited to, a glass epoxy fiber or other nonconductive material. Embedded on the surface of this PCB 10 may be contained surface horizontal conductive features 30. In addition between the layers of dielectric material 20 may be embedded horizontal conductive features (not shown). Various layers of surface and embedded conductive features would be connected via through holes 40 which may be plated or filled with a conductive material and used to establish connections between PCB components and various dielectric layers 20.

Still referring to FIG. 2, in addition to the features previously mentioned in FIGS. 1 and 2, four representative examples of embodiments of the present invention are shown. An embedded conductor channel with electrical connection to adjacent layer 210 is illustrated. This conductor channel with electrical connection to adjacent layer 210 allows for two embedded layers 20 to be supplied power or communicate to each other without the need of a through hole 40 passing through the entire thickness of printed circuit board 10, and provide for greater power, routing and heat dissipation due to a greater cross-sectional area. Thus, using this conductor channel with electrical connection to adjacent layer 210 the need to provide a hole entirely through the PCB 10 is eliminated.

Further, a conductor channel with no electrical connection to an adjacent layer 220 is illustrated in FIG. 2. This conductive channel has no electrical connection to an adjacent layer 220 and may be utilized to supply power to various points on a single dielectric layer 20, as part of shielding for a section of the PCB 10, or for communications within given dielectric layer 20.

Still referring to FIG. 2, a surface embedded conductive channel with electrical connection to an adjacent layer 200 is also illustrated. This surface embedded conductor channel with electrical connection to an adjacent layer 200 may be utilized for shielding, supplying electrical power, or communications between the surface features of the printed circuit board 10 and features in an embedded dielectric layer 20. Further, a conductor channel with no inner layer connection to 30 is shown and may also be used to supply power and communications to surface features of the PCB 10.

Figure 3:
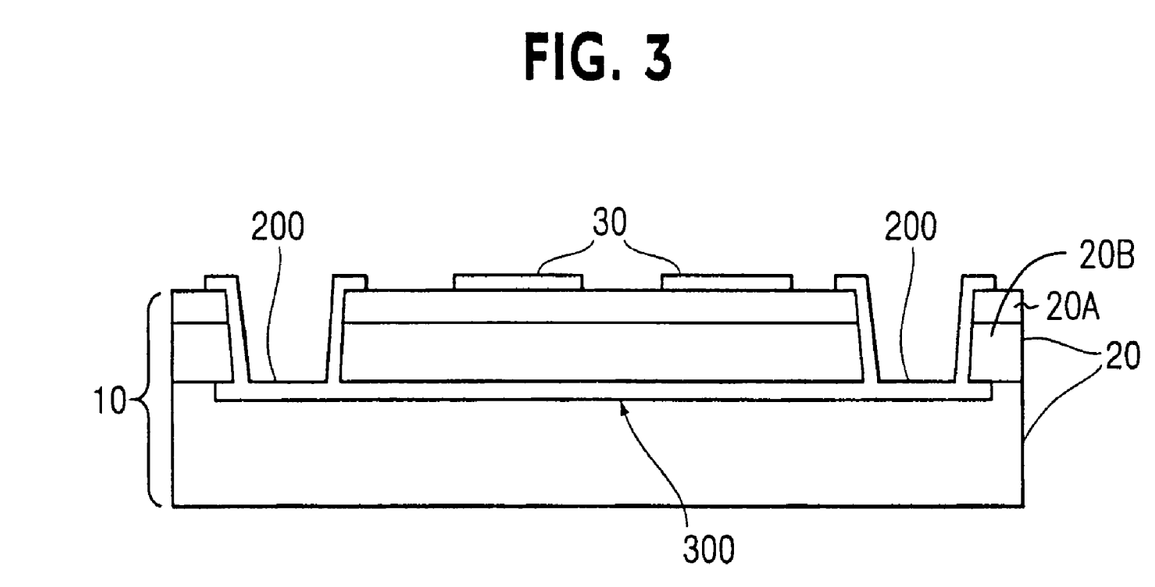
FIG. 3 is a cross-sectional view of a printed circuit board (PCB) with conductor channeling for encapsulation of selected circuitry in an example embodiment of the present invention.

FIG. 3 is a cross-sectional view of a printed circuit board (PCB) 10 with conductor channeling for encapsulation of selected circuitry in an example embodiment of the present invention. The conductor channeling for encapsulation of selected circuitry in PCB 10 would comprise at least one surface embedded conductor channels with electrical connection through a dielectric layer 20 which in an embodiment, which may comprise two or more dielectric layers 20A and 20B, to an adjacent layer 200. The electrical connection to an adjacent layer would comprise an embedded conductor material 300 placed in a dielectric layer 20 which would be suitable for absorption or reflection of electromagnetic radiation. In addition, horizontal conductive features 30 may be placed on top of the PCB 10. As previously discussed these conductive features 30 may supply power or communications to the top dielectric layer 20, but may also provide further shielding for the circuitry encapsulated by the embedded conductor channels with electrical connection to adjacent layers 200 and the embedded conductive layer 300 previously discussed.

Figure 4:
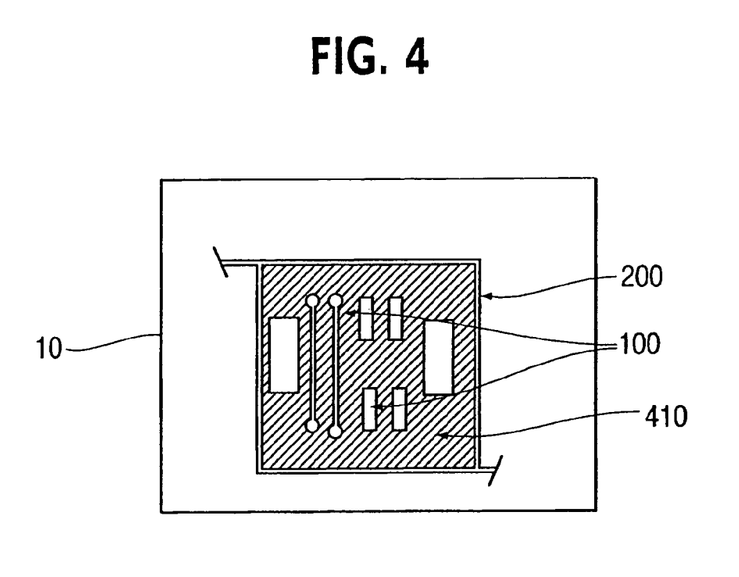
FIG. 4 is a top view of a printed circuit board (PCB) with conductor channeling for encapsulation of selected circuitry in an example embodiment of the present invention.

FIG. 4 is a top view of a printed circuit board (PCB) 10 with conductor channeling 100 for encapsulation of selected circuitry in an example embodiment of the present invention. As previously discussed, at least one surface embedded conductor channels with electrical connection to an adjacent layer 200 would form the outer "wall" to shield the etched features 410 and adjacent copper "Plane" feature or layer.

Figure 5:
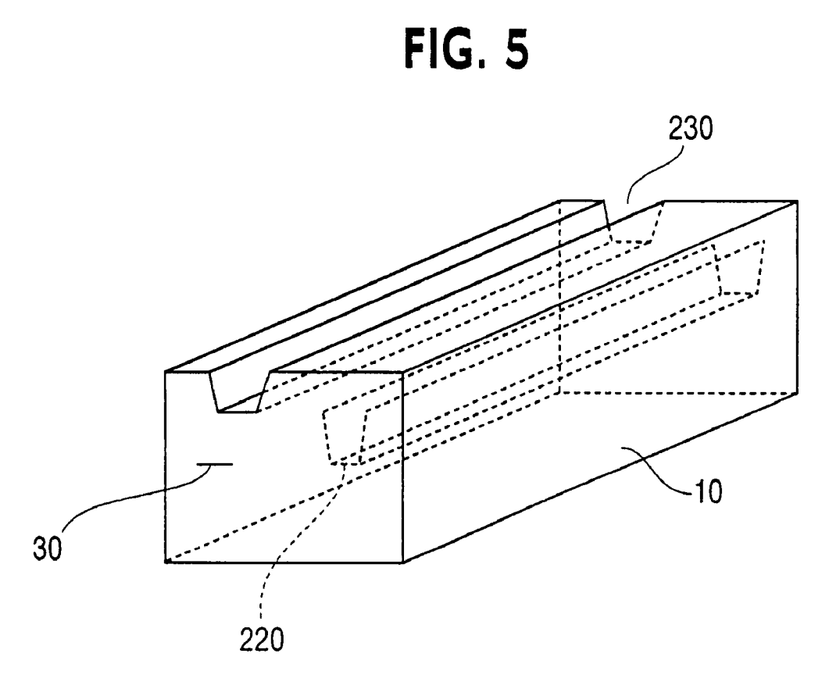
FIG. 5 is a three-dimensional, cross-sectional view of a PCB with surface and embedded conductor channeling in an example embodiment of the present invention.

FIG. 5 is a three-dimensional, cross-sectional view of a PCB 10 with surface and embedded conductor channeling 230 and 220 in an example embodiment of the present invention. As clearly illustrated, embedded conductor channeling 220 is completely encompassed by PCB 10. Further, a horizontal feature 30 may also to embedded within PCB 10.

Figure 6:
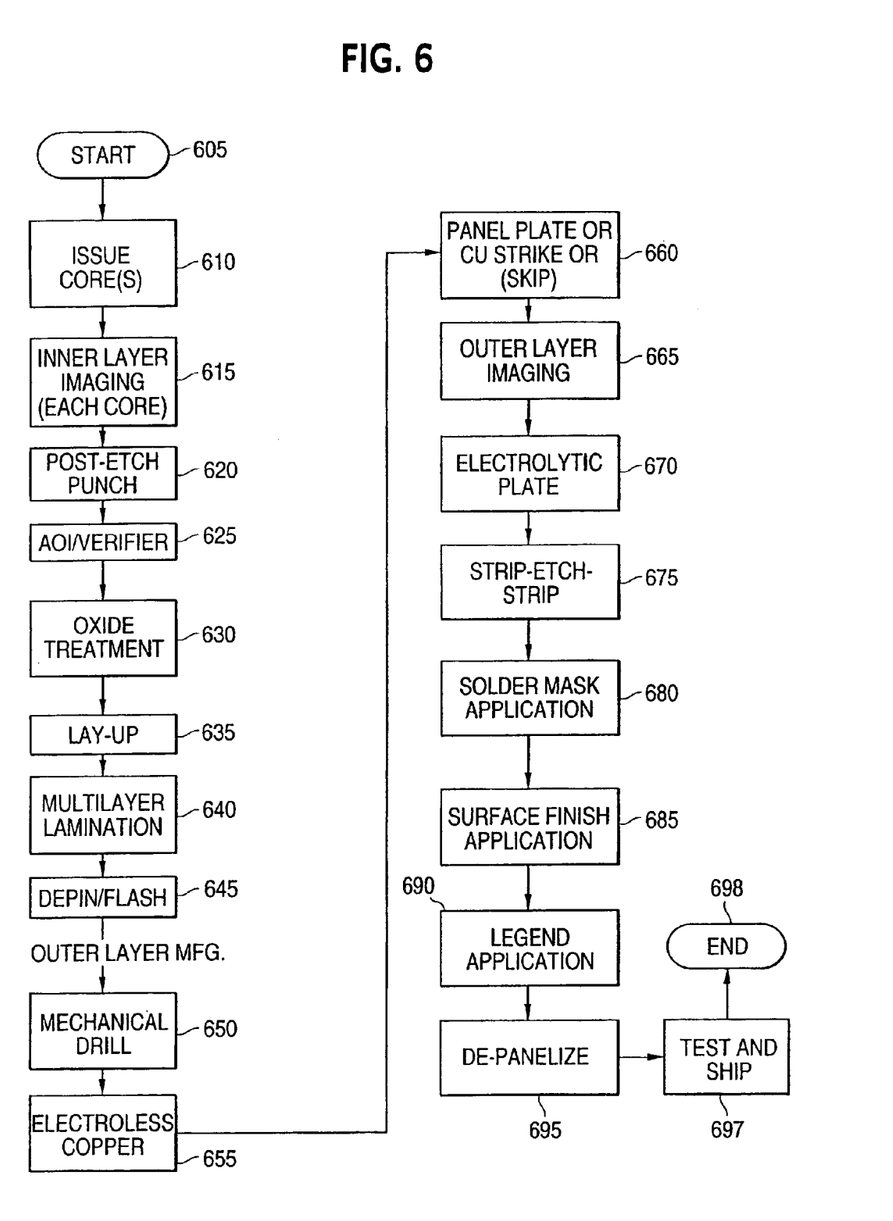
FIG. 6 is a flowchart of a generic process used to generate a PCB.

FIG. 6 is a flowchart of a generic process used to generate a PCB 10. This generic process is provided merely as an example of how a multilayered printed circuit boards may be manufactured. As would be appreciated by one of ordinary skill in the art, the process would vary based on the type of printed circuit board in question and the preferences of the specific manufacturer. Further, as would be appreciated by one of ordinary skill in the art, multilayered printed circuit boards may also be manufactured using a sequential lamination process and the embodiments of the present invention would operate equally as well with the generic process shown in FIG. 6 or employing any well-known sequential lamination process.

Still referring to FIG. 6, the process begins execution in operation 605 and immediately proceeds to operation 610. In operation 610 issue cores are first generated which are dependent upon the printed circuit and lamination design used. In operation 615, inner layer imaging for each core occurs. Operation 615 would include pre-cleaning, resist application, exposing the image, developing, etching and then stripping the undesired resist from the substrate. Thereafter, in operation 620 post etched punching may occur if applicable. In operation 625, automated optical inspection (AOI) verification occurs in order to determine if any copper defects can be found. In operation 630, the core is treated with a copper adhesion promoter such as an oxide. This oxide treatment is a coating placed on the copper layer which allows pre-preg to stick to the copper with superior adhesion. Then in operation 635 a lay-up process occurs for pre-preg cores. This lay-up process entails placing the inner layer cores, pre-preg and copper foils into press books. In operation 640, multi-layer lamination would occur depending upon the number of the dielectric layers 20 within the particular PCB 10. Thereafter, a depin/flash process occurs in operation 645 that completes the inner layer manufacturing process.

Still referring to FIG. 6, in operation 650 mechanical drilling occurs to place through holes 40 through the desired the dielectric material 20 layers. This mechanical drilling process in operation 650 would include de-burring as well as checking the through holes 40 created. In operation 655, an electro-less copper process is used to plate through the through holes 40. As would be appreciated by one of ordinary skill in the art, any metalizing technique may be used to place metal into the through holes 40. Thereafter, panel plate or copper strike methodology is used for panel plating or flash plating the printed circuit board 10 and would occur in operation 660. As would be appreciated by one of ordinary skill in the art this step may be skipped depending on the design of the printed circuit board 10 and the preferences of the manufacturer.

Still referring to FIG. 6, in operation 665 outer layer imaging would occur. This would include pre-cleaning of the printed circuit board 10, resist application, exposing the image, and developing same. In operation 670 electrolytic plating would occur. This would entail the use of copper/tin with tin as the etch resist. Other methods would entail the use of a permanent finish such as that achieved with gold.

Thereafter, in operation 675 a strip-etched-strip process would occur in which the resist is stripped, the copper is etched and the tin is stripped. In operation 680, solder mask application occurs in which the service is pre-cleaned, the solder mask is coated, tack is dried, the image is exposed and developed, and the solder mask is cured. Then in operation 685, the surface finish application is completed. This final service finishing can take a variety of forms as are well-known in the art and can occur at different locations within the process. In operation 690, a legend application occurs which may also occur at different locations within the process. Then in operation 695 de-panelization occurs in which the images of the printed circuit board 10 are separated. Thereafter, in operation 697 testing and shipping occur. This testing and shipping would entail electrical testing of the printed circuit board 10 visual inspection, packaging and shipping. Thereafter, processing terminates in operation 698.

Figure 7:
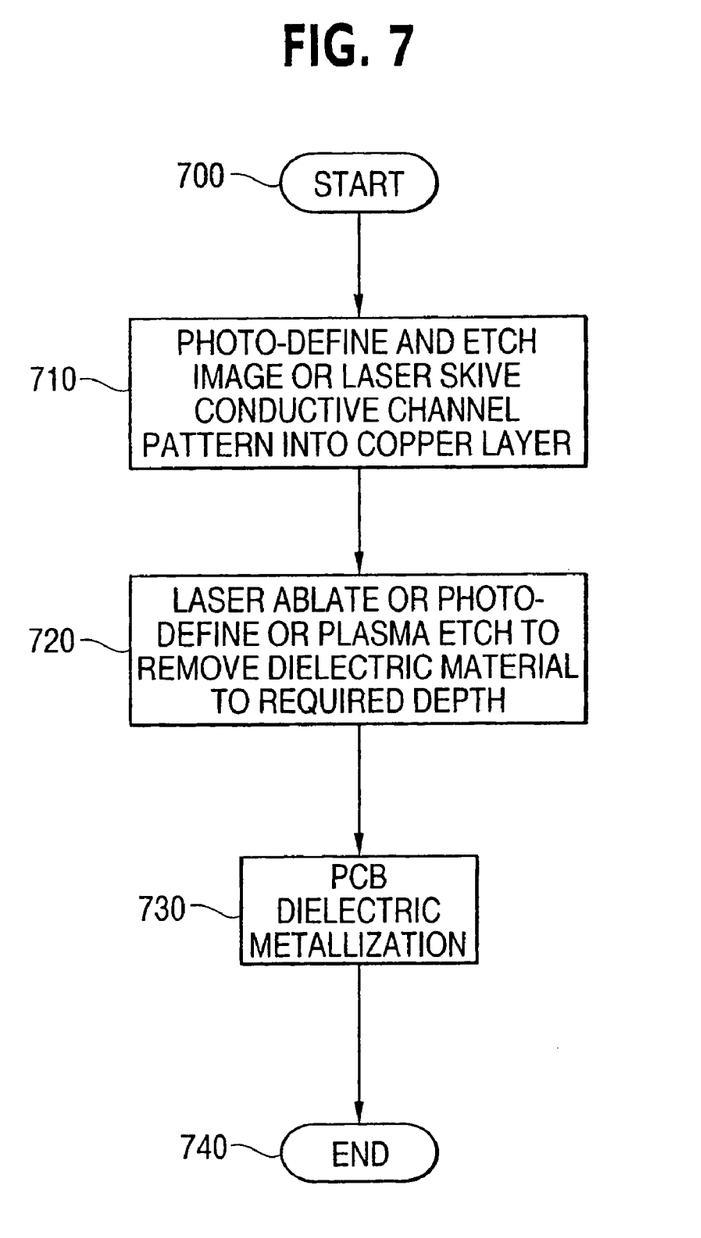
FIG. 7 is a flowchart of a process to generate conductor channeling in a PCB in an example embodiment of the present invention.

FIG. 7 is a flowchart of a process to generate conductor channeling as illustrated in FIGS. 2–5 in a PCB 10 in an example embodiment of the present invention. The process begins in operation 700 and immediately proceeds operation 710. In operation 710 the conductor channels are patterned into the copper layer either through photo defining, image etching, or laser skive methodology. In operation 720 either through laser ablating, plasma etching, or a photo lithography method, the conductor channels are created in a dielectric layer 20 of the PCB 10. Thereafter, in operation 730 PCB 10 dielectric metallization is performed to place a suitable volume of metal within the conductor channels created. Thereafter, processing proceeds to operation 740 where processing terminates.

Figure 8:
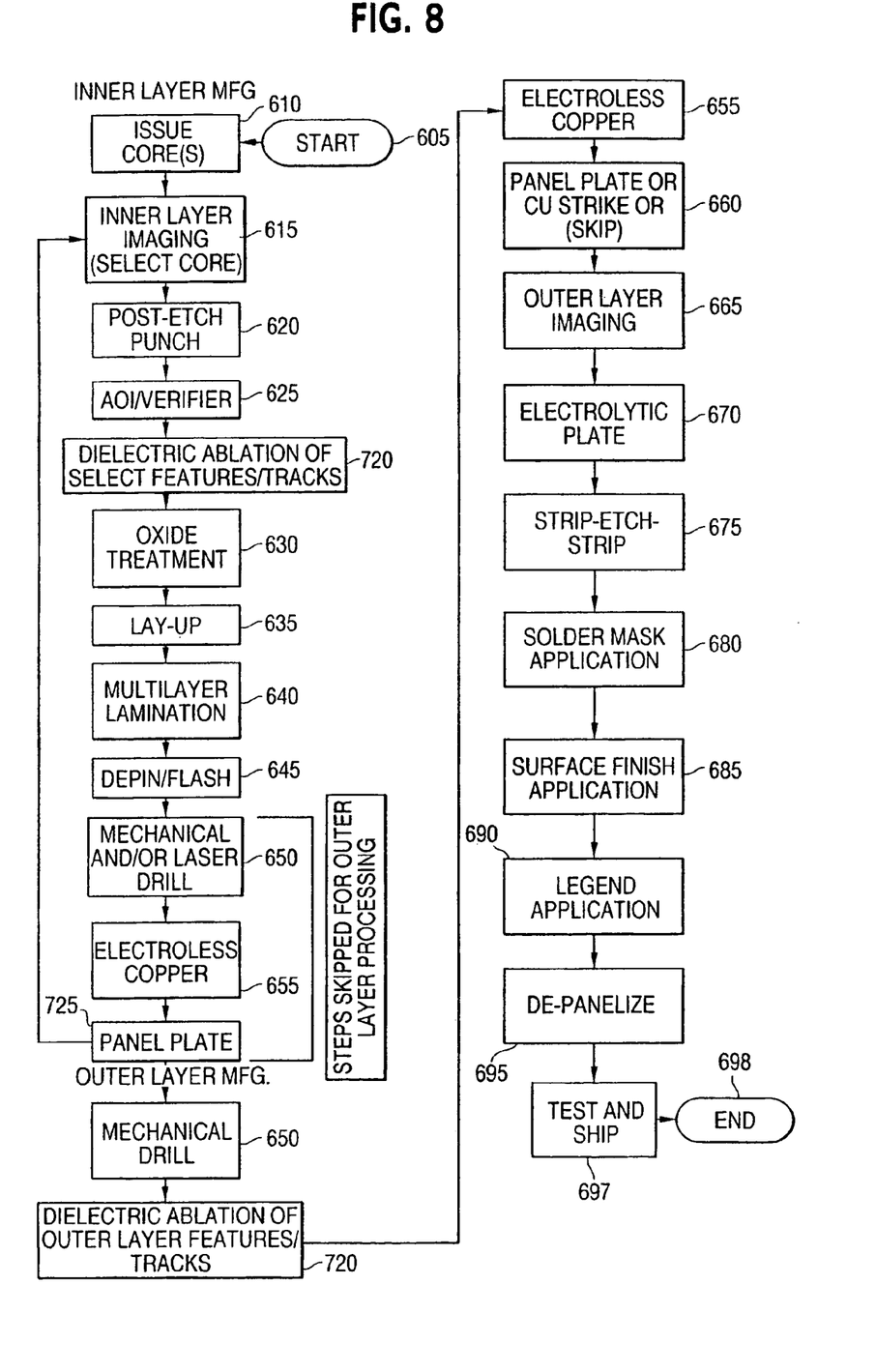
FIG. 8 is a flowchart of a process to generate conductor channeling in a PCB incorporated in the generic process to create a PCB in an example embodiment of the present invention.

FIG. 8 is a flowchart of a process to generate conductor channeling in the PCB 10 incorporated in the generic process to create a PCB 10 illustrated in FIG. 6 in an example embodiment of the present invention. It should be noted that FIG. 8 is similar to FIG. 6 with the exception that the conductor channeling features, shown in FIGS. 2–5, and as illustrated in the process shown in FIG. 7 have been incorporated into FIG. 8. Therefore, a discussion of those features that remained unchanged from FIG. 6 will not be discussed in reference to the discussion of FIG. 8.

Still referring to FIG. 8, it should be noted that operation 720 appears twice in FIG. 8. This is done to illustrate that conductor channeling may occur for both inner dielectric layers 20 and the outer most layers of the PCB 10. Operation 720 is the dielectric ablating of select features relating to conductor channeling shown in FIGS. 2–5. As previously discussed in reference to FIG. 7, this ablating process may occur through either laser ablation, plasma etching, or a photo lithography method. In addition, operation 655 and operation 725 dealing with panel plating would be used to place metal in the conductor channels illustrated in FIGS. 2–5. In addition, as indicated in FIG. 8 operation 650, 655, and 725 would only occur during inner layer processing. Again, after mechanical drilling takes place in operation 650, operation 720 is repeated to ablate the conductor channels for the outer dielectric layer 20 of the PCB 10.

The benefit resulting from some process embodiments of the present invention is that a simple, reliable, system and method is provided for shielding selected portions of a PCB 10. Further, this system and method provides for greater power routing and heat dissipation due to the greater cross-sectional area provided for both in the inner layers of the PCB 10 and the surface layer of PCB 10 to some determined depth. In addition, this system and method should reduce the number of through holes 40 required to connect various surface and embedded electric layers of PCB 10.

While we have shown and described only a few examples herein, it is understood that numerous changes and modifications as known to those skilled in the art could be made to the example embodiments of the present invention. Therefore, we do not wish to be limited to the details shown and described herein, but intend to cover all such changes and modifications as are encompassed by the scope of the appended claims and their equivalents.

We claim:

1. A printed circuit board, comprising:
   a plurality of dielectric layers having embedded and surface conductive features, wherein the plurality of dielectric layers are laminated together; and
   at least one conductor channel embedded in at least one of the plurality of dielectric layers each of the at least one channels, comprising:
   two side walls and a floor in which the two side walls extend to a depth of at least one of the dielectric layers, wherein the at least one conductor channel has an electrically conductive material at least partially deposited on the two side walls and the floor thereof and has dielectric material deposited over the electrically conductive material deposited on the two side walls and floor of the at least one conductor channel.

2. The printed circuit board recited in claim 1, wherein the at least one conductor channel extends to a depth of two or more dielectric layers of the printed circuit board.

3. The printed circuit board recited in claim 2, wherein the at least one conductor channel establishes electrical conductivity with two more dielectric layers of the printed circuit board.

4. The printed circuit board recited in claim 2, wherein the at least one conductor channel completely surrounds a circuit formed in at least one of the dielectric layers of the printed circuit board.

5. The printed circuit board recited in claim 2, wherein the at least one conductor channel is embedded entirely within one or more inner layers of the plurality of dielectric layers of the printed circuit board.

6. The printed circuit board recited in claim 5, wherein the at least one conductor channel is connected to a plurality of embedded conductive features.

7. The printed circuit board recited in claim 2, wherein the at least one conductor channel is embedded in the surface dielectric layer and penetrates into one or more inner layers of the plurality of dielectric layers of the printed circuit board.

8. The printed circuit board recited in claim 7, wherein the at least one conductor channel is connected to a plurality of surface conductive features.

9. The printed circuit board recited in claim 8, wherein the at least one conductor channel provides for an increased cross-sectional surface area enables greater power, and heat dissipation.

10. A printed circuit board, comprising:
    a plurality of dielectric layers having embedded and surface conductive features, wherein the plurality of dielectric layers are laminated together; and
    at least one conductor channel embedded in at least one of the plurality of dielectric layers wherein the at least one conductor channel extends to a depth of two or more dielectric layers of the printed circuit board and, wherein a metallic layer is connected to at least one conductor channel that completely surrounds a circuit formed in at least one of the dielectric layers of the printed circuit board and forms a shield against electromagnetic radiation in conjunction with the at least one conductor channel, each of the at least one channels, comprising:

two side walls and a floor in which the two side walls extend to a depth of at least one of the dielectric layers, wherein the at least one conductor channel has an electrically conductive material at least partially deposited on the two side walls and the floor thereof.

11. A printed circuit board, comprising:

a plurality of dielectric layers having embedded and surface conductive features, wherein the plurality of dielectric layers are laminated together;

an embedded conductor channel embedded in at least one of the plurality of dielectric layers, and a surface conductor channel embedded in an outermost dielectric layer, wherein said embedded conductor channel and said surface conductor channel each comprise two side walls and a floor in which the two side walls extend to a depth of at least one of the plurality of dielectric layers, wherein the at least one conductor channel has an electrically conductive material at least partially deposited on the two side walls and the floor thereof and dielectric material deposited over the electrically conductive material on the two side walls and floor.

12. The printed circuit board recited in claim 11, wherein the embedded conductor channel extends to a depth of two or more dielectric layers of the printed circuit board.

13. The printed circuit board recited in claim 12, wherein the outermost conductor channel extends to a depth of two or more dielectric layers of the printed circuit board.

14. The printed circuit board recited in claim 11, wherein the embedded conductor channel establishes electrical conductivity with two more dielectric layers of the printed circuit board.

15. The printed circuit board recited in claim 14, wherein the outermost conductor channel establishes electrical conductivity with two more dielectric layers of the printed circuit board.

16. The printed circuit board recited in claim 15, wherein the outer most conductor channel is connected to a plurality of embedded conductive features.

17. The printed circuit board recited in claim 14, wherein the embedded conductor channel is connected to a plurality of embedded conductive features.

* * * * *

UNITED STATES PATENT AND TRADEMARK OFFICE
CERTIFICATE OF CORRECTION

| | | |
|---|---|---|
| PATENT NO. | : 7,061,095 B2 | |
| APPLICATION NO. | : 09/962094 | |
| DATED | : June 13, 2006 | |
| INVENTOR(S) | : Boggs et al. | |

It is certified that error appears in the above-identified patent and that said Letters Patent is hereby corrected as shown below:

On the Title page, in item (56), under "Foreign Patent Documents", in column 2, line 1, after "4/1998" insert -- H01L 21/768 --.

On the Title page, in item (57), under "Abstract", in column 2, line 3, delete "provided" and insert -- provide --, therefor.

Column 8, line 18, in Claim 16, delete "outer most" and insert -- outermost --, therefor.

Signed and Sealed this

Fourteenth Day of November, 2006

JON W. DUDAS
*Director of the United States Patent and Trademark Office*